United States Patent [19]

Nath et al.

[11] Patent Number: 4,633,034
[45] Date of Patent: Dec. 30, 1986

[54] PHOTOVOLTAIC DEVICE AND METHOD

[75] Inventors: Prem Nath, Rochester; Timothy J. Barnard, Lake Orion; Dominic Crea, Mt. Clemens, all of Mich.

[73] Assignee: Energy Conversion Devices, Inc., Troy, Mich.

[21] Appl. No.: 699,524

[22] Filed: Feb. 8, 1985

[51] Int. Cl.$^4$ .................... H01L 31/06; H01L 31/18
[52] U.S. Cl. .................... 136/256; 136/249; 136/258; 357/30; 357/65; 29/572; 427/74
[58] Field of Search .......... 136/249 TJ, 256, 258 AM, 136/260; 357/30, 65; 29/572; 427/74; 204/56 R

[56] References Cited

U.S. PATENT DOCUMENTS 4,251,286  2/1981  Barnett .................... 136/260

FOREIGN PATENT DOCUMENTS 56-69872  6/1981  Japan .................... 136/258 AM
58-39073  3/1983  Japan .................... 136/258 AM Primary Examiner—Aaron Weisstuch
Attorney, Agent, or Firm—Ronald W. Citkowski; Marvin S. Siskind

[57] ABSTRACT

An improved photovoltaic device exhibiting increased tolerance of shorting and shunting defects includes a pattern of current flow restricting material operatively disposed so as to limit the flow of electrical current between the substrate and the current collector of the device. Also disclosed are methods for the fabrication of the improved device.

27 Claims, 5 Drawing Figures

PHOTOVOLTAIC DEVICE AND METHOD

FIELD OF THE INVENTION

This invention relates generally to photovoltaic devices, and especially to thin film photovoltaic devices. More particularly, the present invention relates to photovoltaic devices having current collection means such as a bus grid structure which has at least portions thereof electrically isolated from portions of the substrate therebeneath, so as to substantially eliminate the flow of electrical current therebetween. The invention is particularly useful in the manufacture of large area, thin film photovoltaic devices, insofar as it provides a structure and method for minimizing the effect of current shunting defects which may be present in the photovoltaic devices.

BACKGROUND OF THE INVENTION

Single crystal photovoltaic devices, especially silicon photovoltaic devices, have been utilized for some time as sources of electrical power because they are inherently non-polluting, silent, and consume no expendable natural resources in their operation. However, the utility of such devices is limited by problems associated with the manufacture thereof. More particularly, single crystal materials (1) are difficult to produce in sizes substantially larger than several inches in diameter, (2) are thicker and heavier than their thin film counterparts; and (3) are expensive and time consuming to fabricate.

Recently, considerable efforts have been made to develop processes for depositing amorphous semiconductor films, each of which can encompass relatively large areas, and which can be doped to form p-type and n-type materials for the production of p-i-n type devices substantially equivalent to those produced by their crystalline counterparts. It is to be noted that the term "amorphous" as used herein, includes all materials or alloys which have long range disorder, although they may have short or intemediate range order or even contain, at times, crystalline inclusions.

For many years, such work with amorphous silicon or germanium films was substantially unproductive because of the presence therein of microvoids and dangling bonds which produce a high density of localized states in the energy gap, which states are derogatory to the electrical properties of such films. Initially, the reduction of the localized states was accomplished by glow discharge deposition of amorphous silicon films, wherein silane ($SiH_4$) gas is passed through a reaction tube where the gas is decomposed by a radio frequency (r.f.) glow discharge to deposit a silicon based material on a substrate maintained at a temperature of about 500–600 degrees K. (227–327 degrees C.). The material so deposited on the substrate is an intrinsic amorphous material consisting of silicon and hydrogen. To produce a doped amorphous material an N-dopant such as phosphine gas ($PH_3$), or a P-dopant such as diborane ($B_2H_6$) gas, is premixed with the silane gas and passed through the glow discharge reaction tube under the same operating conditions. The material so deposited includes supposedly substitutional phosphorus or boron dopants and is shown to be extrinsic and of n or p conduction type. The hydrogen in the silane was found to combine, at an optimum temperature, with many of the dangling bonds of the silicon during the glow discharge deposition to substantially reduce the density of the localized states in the energy gap, thereby causing the amorphous material to more nearly approximate the corresponding crystalline material.

It is now possible to prepare by glow discharge or vapor deposition, thin film amorphous silicon or germanium based alloys in large areas, said alloys possessing acceptable concentrations of localized states in the energy gaps thereof and high quality electronic properties. Suitable techniques are fully described in U.S. Pat. No. 4,226,898, entitled "Amorphous Semiconductor Equivalent to Crystalline Semiconductors," of Stanford R. Ovshinsky and Arun Madan which issued Oct. 7, 1980 and in U.S. Pat. No. 4,217,374, under the same title, which issued on Aug. 12, 1980, to Stanford R. Ovshinsky and Masatsugu Izu, and U.S. Pat. No. 4,517,223 of Stanford R. Ovshinsky, David D. Allred, Lee Walter and Stephen J. Hudgens entitled "Method of Making Amorphous Semiconductor Alloys and Devices Using Microwave Energy," which patents are assigned to the assignees of the instant invention, the disclosures of which are incorporated herein by reference. As disclosed in these patents, it is believed that fluorine introduced into the amorphous semiconductor operates to substantially reduce the density of the localized states therein and facilitates the addition of other alloying materials.

Owing to the small size of its atoms, activated fluorine is believed to readily diffuse into, and bond to, amorphous matrix forming materials such as silicon so as to substantially decrease the density of localized defect states therein. The fluorine is believed to bond to the dangling bonds of the matrix material and form a partially ionic, stable bond with flexible bonding angles, thereby resulting in a more stable and more efficient compensation or alteration than could be effected by hydrogen or other compensating or altering agents which were previously employed.

Compensation may be achieved with fluorine, alone or in combination with hydrogen, by the addition of such element(s) in even very small quantities (e.g., fractions of one atomic percent). However, the amounts of fluorine and hydrogen most desirably used are generally much greater than such small percentages. Alloying amounts of fluorine and hydrogen may, for example, be used in a range of 0.1 to 5 percent or greater, so as to form a silicon:hydrogen:fluorine alloy. The alloy thus formed has a lower density of defect states in the energy gap than can be achieved by the mere neutralization of dangling bonds and similar defect states. In particular, it appears that fluorine effects a new structural configuration of an amorphous silicon-containing material and facilitates the addition of other alloying materials, such as germanium. Fluorine is also believed to (1) be an organizer of local structure in the silicon-containing alloy through inductive and ionic effects, and (2) also influence the bonding of hydrogen by acting to decrease the density of the defect states which hydrogen normally contributes. The ionic role that fluorine plays in such an alloy is an important factor in terms of the nearest neighbor relationships.

The concept of utilizing multiple cells, to enhance photovoltaic device efficiency, was disclosed at least as early as 1955 by E. D. Jackson, in U.S. Pat. No. 2,949,498, issued Aug. 16, 1960. The multiple cell structures therein disclosed utilized p-n junction crystalline semiconductor devices. Essentially, the concept is directed to utilizing different band gap devices to more efficiently collect various portions of the solar spectrum and to increase open circuit voltage (Voc.). The tandem cell device has two or more cells with the light directed serially through each cell, with a large band gap material followed by a smaller band gap material to absorb the light passed through the first cell or layer. By substantially matching the generated currents from each cell, the overall open circuit voltage is the sum of the open circuit voltage of each cell, while the short circuit current remains substantially constant. It should be noted that Jackson employed crystalline semiconductor materials for the fabrication of the stacked cell device; however, it is virtually impossible to match lattice constants of differing crystalline materials. Therefore, it is not possible to fabricate such crystalline tandem structures in a commercially feasible manner. As the assignee of the instant invention has shown, however, such tandem structures are not only possible, but can be economically fabricated in large areas by employing amorphous materials.

It is of obvious commercial importance to be able to mass produce photovoltaic devices such as solar cells. However, with crystalline cells, mass production was limited to batch processing techniques by the inherent growth requirements of the crystals. Unlike crystalline silicon, amorphous silicon alloys can be deposited in multiple layers over large area substrates to form solar cells in a high volume, continuous processing system. Such continuous processing systems are disclosed in the following U.S. Patents: U.S. Pat. No. 4,400,409, for A Method of Making P-Doped Silicon Films And Devices Made Therefrom; U.S. Pat. No. 4,410,588, for Continuous Amorphous Solar Cell Deposition And Isolation System And Method; U.S. Pat. No. 4,542,711, for Continuous Systems For Depositing Amorphous Semiconductor Material; U.S. Pat. No. 4,492,181, for Method And Apparatus For Continuously Producing Tandem Amorphous Photovoltaic Cells; and U.S. Pat. No. 4,485,125, for Method And Apparatus For Continuously Producing Tandem Amorphous Photovoltaic Cells. As disclosed in these patents, the disclosures of which are incorporated herein by reference, a substrate may be continuously advanced through a succession of deposition chambers, wherein each chamber is dedicated to the deposition of a specific semiconductor material. In making a solar cell of p-i-n type configuration, the first chamber is dedicated for depositing a p-type amorphous silicon alloy, the second chamber is dedicated for depositing an intrinsic amorphous silicon alloy, and the third chamber is dedicated for depositing an n-type amorphous silicon alloy.

Since each deposited semiconductor alloy, and especially the intrinsic semiconductor alloy, must be of high purity: (1) the deposition environment in the intrinsic deposition chamber is isolated, by specially designed gas gates, from the doping constituents within the other chambers to prevent the diffusion of doping constituents into the intrinsic chamber; (2) the substrate is carefully cleansed prior to initiation of the deposition process to remove contaminants; (3) all of the chambers which combine to form the deposition apparatus are sealed and leak checked to prevent the influx of environmental contaminants; (4) the deposition apparatus is pumped down and flushed with a sweep gas to remove contaminants from the interior walls thereof; and (5) only the purest reaction gases are employed to form the deposited semiconductor materials. In other words, every possible precaution is taken to insure that the sanctity of the vacuum envelope formed by the various chambers of the deposition apparatus remains uncontaminated by impurities, regardless of origin.

The layers of semiconductor material thus deposited in the vacuum envelope of the deposition apparatus may be utilized to form a photovoltaic device including one or more p-i-n cells, one or more n-i-p cells, a Schottky barrier, as well as photodiodes, phototransistors, or the like. Additionally, by making multiple passes through the succession of deposition chambers, or by providing an additional array of deposition chambers, multiple stacked cells of various configurations may be obtained.

As is obvious from the foregoing, thin film amorphous semiconductor materials offer several distinct advantages over crystalline materials, insofar as they can be easily and economically fabricated by the newly developed mass production processes. However, in the fabrication of semiconductor material by the aforementioned processes, the presence of current-shunting defects has been noted. These defects have (1) seriously impaired the performance of the photovoltaic devices fabricated therefrom and (2) detrimentally affected production yield. These process-related defects are thought to either (1) be present in the morphology of the substrate electrode, or (2) develop during the deposition of the semiconductor layers. It is to the end of eliminating, or at least substantially reducing the effects of these current-shunting defects to which the instant invention is directed.

The most important of these defects may be characterized as "shunts", "short-circuits", defect regions, or low resistance current paths. Before the suspected causes of these defects are explained, it is helpful to note the thicknesses of the deposited semiconductor layers. In typical p-i-n type photovoltaic device, the "p" layer may be only on the order of 250 angstroms thick, the "i" layer may be only on the order of 3,500 angstroms thick, and a typical "n" layer may be only on the order of 250 angstroms thick, thereby providing a total semiconductor body thickness of only about 4,000 angstroms. It should therefore be appreciated that irregularities, however small, will not be readily covered by the deposited semiconductor layers.

Shunt defects are present when one or more low resistance current paths develop between the electrodes of the photovoltaic device. Under operating conditions, a photovoltaic device in which a shunt defect has developed, exhibits either (1) a low power output, since electrical current collected at the electrodes flows through the defect region (the path of least resistance) in preference to an external load, or (2) complete failure where sufficient current is shunted through the defect region to "burn out" the device.

While shunt-type defects always deleteriously affect the performance of photovoltaic devices, their effect is greatest when the devices in which they are incorporated are operated under relatively low illumination such as room light, vis-a-vis, high intensity illumination such as an AM-1 solar spectrum. Under room light illumination, the load resistance of the cell (i.e., the resistance under which the cell is designed to operate most efficiently) is comparable to the shunt resistance (i.e., the internal resistance imposed by the defect region), whereas under AM-1 illumination, the load resistance is much lower by comparison. This occurs because, in a photovoltaic device, photogenerated current increases linearly with increasing illumination, while the resulting voltage increases exponentially. In other words, voltage attains a relatively high value under low illumination, the value increasing only slightly as the intensity of the illumination is increased. Therefore, under low illumination the relatively high voltage potential present preferentially drives the relatively small number of photogenerated current carriers through the path of least resistance, i.e., the low resistance defect regions. In contrast thereto, under high illumination, a large number of current carriers are present and are driven by a potential of about the same magnitude as the potential which exists under low illumination. This larger number of current carriers compete for a limited number of least resistance paths (through the defect regions). The result is that at high intensity, while more power may be lost to the defect region, the power lost is a smaller percentage of the total power produced than at low intensity illumination.

Defects or defect regions, the terms being interchangeably used herein, are not limited to "overt" or "patent" short circuit current paths. In some cases, the adverse effects of a defect are latent and do not immediately manifest themselves. Latent defects can give rise to what will be referred to hereinafter as an "operational mode failure", wherein a photovoltaic device, initially exhibiting satisfactory electrical performance, suddenly fails. The failures will be referred to in this application as operational mode failures regardless of whether the device was previously connected to a load for the generation of power, it only being necessary that the device was, at some time subjected to illumination, thereby initiating the generation of carriers. This type of failure will be discussed in further detail hereinbelow. It is believed the shunt defects, both latent and patent, arise from one or more irregularities in the (1) morphology of the substrate material, or (2) in the growth of the semiconductor layers.

The first, and perhaps most important, source of the defects, i.e., the aforementioned morphological irregularities in the deposition surface of the substrate material will now be discussed. Even though the highest quality stainless steel is employed to serve as the substrate or base electrode upon which the semiconductor layers are successively deposited, it has been calculated that from 10,000 to 100,000 irregularities per square centimeter are present on the deposition surface thereof. Such irregularities take the form of projections, craters, or other deviations from a smooth finish and may be under a micron in (1) depth below the surface, (2) height above the surface, or (3) diameter. Regardless of their configuration or size, the defects may establish a low resistance current path through the semiconductor body, thereby effectively short-circuiting the two electrodes. This may occur in numerous ways. For instance, a spike projecting from the surface of the substrate electrode may be of too great a height to be covered by the subsequent deposition of semiconductor layers, and therefore, be in direct electrical contact with the other electrode when that electrode is deposited atop the semiconductor layers. Likewise, a crater formed in the surface of the substrate electrode may be of too small a size to be filled by the subsequent deposition of semiconductor layers and therefore, be in relatively close proximity to the other electrode, when that electrode is deposited atop the semiconductor layers. In such an instance: (1) electrical current may bridge the gap which exists between the electrodes, or (2) during actual use (the photoinduced generation of electrical current) of the photovoltaic device, the material of one of the electrodes may, under the influence of the electrical field, migrate toward and contact the other of the electrodes, and thereby pass electrical current therebetween. It is also possible that in some cases the semiconductor layers deposited onto the substrate include regions of irregular composition which can provide low resistance paths for the flow of electrical current between the electrodes of the photovoltaic device.

Further, despite all the previously described efforts to maintain the vacuum envelope free of external contaminants, dust or other particulate matter, which somehow either (1) invades the vacuum envelope during the deposition of the semiconductor material, or (2) forms as a by-product of the deposition process, may be deposited over the substrate electrode along with the semiconductor material. The contaminants interfere with the uniform deposition of the semiconductor layers and may establish the low resistance current paths therethrough.

Additionally, it is suspected that in some cases, the semiconductor material may form micro-craters or micro-projections during the deposition thereof, even absent the presence of contaminants or pollutants from external sources. Such morphological deviation from a perfectly smooth and even surface means that the substrate is covered by semiconductor material either (1) in an "ultra thin layer" (consider again that the total thickness of all semiconductor layers is only on the order of 4,000 angstroms and any reduction in coverage is indeed an ultra thin layer) or (2) not at all. Obviously, when the upper electrode material is deposited across the entire surface of the semiconductor body, the defect regions cause the low resistance current path to develop, and electrical current is shunted therethrough. In still other cases involving defect regions, the presence of such defect regions is only detectable due to their deleterious effect upon the electrical and photoelectric properties of the resultant photovoltaic device. Finally, note that the defects described hereinabove may not be sufficiently severe to divert all electrical current through the low resistance path. However, the diversion or shunting of any current therethrough represents a loss in operational efficiency of the photovoltaic device and should therefore be eliminated. Moreover, the shunting of even small amounts of current through each of thousands of defect regions may combine to cause major losses in efficiency. Based upon the foregoing, it should be apparent that a reduction in current flow through these defects and defect regions is critical to the fabrication of high-yield, high efficiency, large area thin film photovoltaic devices.

Several approaches dealing with gross amplifications of this problem have been implemented by Applicants and their colleagues. As described in U.S. Pat. No. 4,451,970 of Masatsugu Izu and Vincent Cannella, entitled "System and Method For Eliminating Short Circuit Current Paths In Photovoltaic Devices," said patent assigned to the assignee of the instant application, the shunting of current through defect regions is treated by substantially eliminating the defect regions as an operative area of the semiconductor device. This is accomplished fn an electrolytic process where electrode material is removed from the periphery of the defect site, effectively isolating the defect regions and preventing the flow of electrical current through the defect region. However, the process described in the '970 patent is current dependent, i.e., the greater the current flowing through a particular area of the device, such as a defect region, the greater the amount of electrode material (in the preferred embodiment indium tin oxide) removed. Consequently, said short circuit eliminating process performs admirably in removing the electrode material from the periphery of a large defect, and thereby preventing all current flow therethrough. However, it is not as successful in eliminating the flow of current between the electrodes in the thousands of defect regions which are relatively small. And as previously mentioned, since a great many relatively small current shunting paths taken in toto, divert a substantial amount of current from its desired path of travel, the low resistance current paths created by such small defect regions must also be eliminated or at least substantially reduced. Further, the electrolytic process described in the '970 patent neither detects nor helps in preventing the formation of current-shunting paths in the case of operational mode failures.

In U.S. Pat. No. 4,419,530 of Prem Nath, entitled "Improved Solar Cell And Method For Producing Same", and assigned to the assignee of the instant patent application, there is described a method for electrically isolating small area segments of an amorphous, thin film, large area photovoltaic device. This isolation of defects is accomplished by (1) dividing the large area device into a plurality of small area segments, (2) testing the small area segments for electrical operability, and (3) electrically connecting only those small area segments exhibiting a predetermined level of electrical operability, whereby a large area photovoltaic device comprising only electrically operative small area segments is formed.

While the method of Nath is effective in reducing or eliminating the effect of defects, it is not completely satisfactory for several reasons.

The step of dividing the semiconductor body of the solar cell into electrically isolated portions requires several production steps and also reduces the total area of the solar cell that is available for producing electrical energy. Further, the method can be time and cost intensive since the electrical output of each isolated portion must be tested and separate electrical connections must be made to provide electrical contact to each small area segment. Also, since an entire segment is effectively eliminated from the final cell if it manifests a defect, proportional losses of efficiency are greater than they would be if only the precise area of the particular defect were eliminated. In addition, it is possible that defects (shorts) in a solar cell can develop after the cell has been in use, and the concept of dividing the body of the large area cell does not correct this type of defect.

Further, both of the foregoing patent applications relate to "after market" techniques which are applicable to (1) isolate only gross defect-containing regions, and (2) prevent any and all current flow through those defect containing regions. Accordingly, a need still exists for a photovoltaic device which substantially eliminates the deleterious effects of shunts and other defects, both large and small, whatever their origin, without operatively removing large portions of the active semiconductor body while maintaining an acceptable level of current flow across the entire surface of the device.

One such method and device is disclosed in commonly assigned U.S. Pat. No. 4,590,327, of Nath, et al, entitled "Photovoltaic Device And Method", the disclosure which is incorporated herein by reference. Disclosed therein are several configurations of current collecting bus grid structures for photovoltaic devices designed to minimize the effects of shorts, shunts, and other defects upon the performance of the devices.

A differently configured photovoltaic device and method for eliminating the problems of shorts and shunts is disclosed in U.S. patent application Ser. No. 699,523 of Nath, et al, filed concurrently herewith and also entitled "Photovoltaic Device And Method", the disclosure of which is incorporated herein by reference. That application concerns a photovoltaic device having the current collecting bus grid structure disposed beneath the upper, transparent conductive electrode thereof. As disclosed, the bus grid structure may optionally have a layer of insulating material disposed directly therebeneath to prevent direct electrical communication with short circuit defects in the semiconductor body. Disposing the bus grid structure in such a manner will, as discussed in said application, prevent many of the problems associated with short circuit defects. However, new problems arise in the fabrication of such photovoltaic devices when the bus grid structure is formed as a relatively thick member because there may be instances in which the upper transparent conductive electrode of the photovoltaic device is not thick enough to fully cover a bus grid structure of relatively large thickness (for example greater than 1 micron). When thick bus grid structures are employed, breaks may occur in the transparent conductive oxide layer, which breaks could prevent efficient communication of electrical current to the bus grid structure. In some cases this problem can be eliminated by making the bus grid structure thinner, as for example when electroplated metal is utilized for the fabrication thereof; however, in many instances it may be desirable or necessary to employ materials such as conductive inks or pastes for the fabrication of the bus grid structure, which materials cannot be readily applied in thin layers.

Accordingly, there exists need for a defect tolerant photovoltaic device manufactured by a process which does not require covering the current collecting bus grid structure with a coating of transparent conductive material. Disclosed herein are configurations of photovoltaic devices which exhibit a high degree of operational tolerance to the presence of defects therein and which do not have the current collecting bus grid structure thereof disposed beneath the transparent conductive top electrode of the device.

BRIEF DESCRIPTION OF THE INVENTION

Disclosed herein is a photovoltaic device of the type including a substrate, a semiconductor body having a first surface thereof disposed on said substrate, a layer of transparent electrically conductive material overlying, and in electrical contact with at least a portion of the second surface of the semiconductor body and current collection means disposed atop said layer of transparent conductive material. The improvement in the device comprises a pattern of electrical current flow restricting material disposed between the transparent conductive layer and the substrate of the device. The pattern corresponds to, and is disposed beneath at least portions of the superadjacent current collection means and is adapted to restrict the flow of electrical current between said portions of the current collection means and regions of the substrate disposed therebeneath. The current flow restricting material may be formed from a material chosen from the group consisting essentially of: organic insulating materials, inorganic insulators, wide band gap semiconductors, silicones, cermets, and various combinations thereof. According to the principles of the instant invention, the pattern of current flow restricting material may be advantageously disposed between the transparent conductive electrode and the second surface of the semiconductor body, or between the substrate and the first surface thereof.

In one embodiment of the instant invention the current collection means comprises a bus-grid structure which includes a plurality of grid fingers for collecting current from the transparent conductive layer and a bus bar structure in electrical communication with the grid fingers for carrying the current collected thereby. In an another embodiment of the instant invention the current collection means comprises a bus bar structure including a plurality of minor bus bar segments for collecting current from the transparent conductive layer and communicating that current to a major bus bar which conveys that current to one terminal of the photovoltaic device.

The pattern of current flow restricting material may be disposed beneath all of the current collection means or only beneath portions thereof. It has generally been found that it is desirable to dispose the current flow restricting material beneath at least major current carrying portions of the current collection means. In accord with one embodiment of the instant invention, the pattern of current flow restricting material is made approximately 10 to 15% greater in area than the superposed portions of the current collection means. In accord with another embodiment of the instant invention, the current collection means may be configured so as to limit the flow of electrical current therethrough to some predetermined value so as to still further increase the tolerance of the device to low resistance defects. For example, the current collection means may comprises a bus grid structure in which the grid fingers thereof have a limited current carrying capacity and thus will not be able to communicate large amounts of current from short circuit defects to the bus grid structure. The grid fingers may be provided with such limited current carrying capacity by including a resistive link therein connecting each grid finger to its respective bus bar; similarly, a fusible link may be employed to effect the connection, said link adapted to melt and open the circuit when a predetermined amount of current flows therethrough.

There are also disclosed herein methods for the manufacture of the improved, defect tolerant, photovoltaic devices of the instant invention.

DETAILED DESCRIPTION OF THE DRAWINGS

Figure 1:
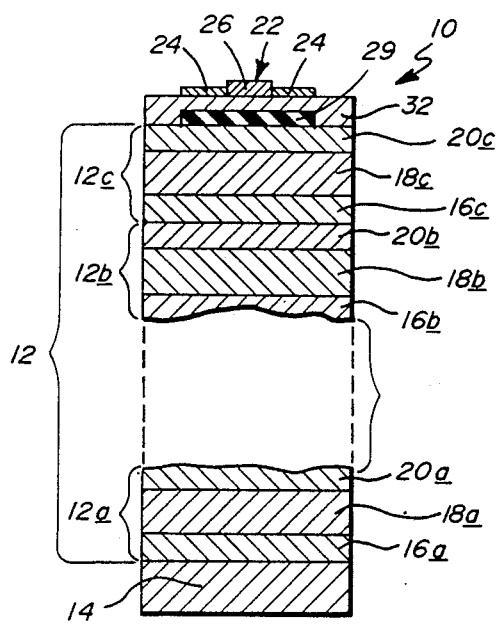
FIG. 1 is a fragmentary, cross-sectional view of a first tandem photovoltaic device structured in accord with the principles of the instant invention and comprising a plurality of p-i-n type photovoltaic cells.

Referring now to the drawings, where like reference numbers designate like structure, and particularly to FIG. 1, a stacked, tandem, or cascade-type photovoltaic device, formed of successive p-i-n layers each including an amorphous semiconductor alloy, is shown generally by the reference numeral 10. One of the methods of the present invention is, in the preferred embodiment, adapted to produce an improved photovoltaic device of this type. However, that method and other methods, also described herein, are not limited solely to the production of stacked p-i-n photovoltaic cells, but are of equal value in the production of any other type of thin film solar cells, such as, for example, n-i-p devices, p-n devices, Schottky barrier devices, MIS (metal-insulator-semiconductor) type cells, or simply the production of improved thin film semiconductor devices. Regardless of cell type, the novel production methods described herein have their greatest utility in connection with photovoltaic devices formed with uniform layers of semiconductor materials and with a uniform, continuous transparent conductive layer deposited over the semiconductor layers.

It is to be understood that in accordance with the invention the semiconductor body of the depicted photovoltaic device may be fabricated from any suitable semiconductor material. Suitable semiconductor materials are those which can be formed into thin films and include, by way of example only, and not as a limitation on the present invention, silicon based, germanium based, cadmium sulfide based, and cadmium tellurium based semiconductor materials.

FIG. 1 shows a tandem photovoltaic device 10, which includes a semiconductor body 12 consisting of a plurality of p-i-n photovoltaic cells 12a, 12b, and 12c. Below lowermost cell 12a is a substrate 14 which may be a metallic member such as an electrically conductive stainless steel sheet or a thin metallic foil, or which may be formed from an electrically insulating material such as glass, plastic and the like, and provided with an electrically conductive member upon at least a portion thereof.

Although certain applications may require a thin oxide layer and/or a series of base contacts deposited upon the substrate prior to deposition of the semiconductor material, for purposes of this application, the term "substrate" shall also include any elements added thereto by preliminary processing.

As illustrated, each of cells 12a, 12b, and 12c includes a semiconductor body containing at least a silicon alloy. Each of the alloy bodies includes a p-type region or layer (16a, 16b, or 16c); an intrinsic region or layer 18a, or 18b, or 18c); and an n-type region or layer (20a, 20b, or 20c). As illustrated, cell 12b is an intermediate cell and, as indicated in FIG. 1, additional intermediate cells may be stacked atop the illustrated cells without departing from the spirit or scope of the present invention. Also, although stacked p-i-n cells are illustrated, this invention is equally adapted for single or stacked n-i-p cells.

For each of cells 12a, 12b, and 12c, the p-type layers are characterized by low light absorption, high conductivity alloy layers. The intrinsic alloy layers are characterized by an adjusted wavelength threshold for a solar photoresponse, high light absorption, low dark conductivity and high photoconductivity, and include sufficient amounts of a band gap adjusting element or elements to optimize the band gap for the particular cell application. Preferably, the intrinsic layers are band gap adjusted to provide cell 12a with a lowest band gap, cell 12c with the highest band gap, and cell 12b with a band gap between the other two. The n-type layers are characterized by low light absorption, high conductivity alloy layers. The thickness of the n-type layers is preferably in the range of about 25 to 500 angstroms. The thickness of the band gap adjusted, amorphous intrinsic alloy layers is preferably between about 2,000 angstroms to 30,000 angstroms. The thickness of the p-type layers is preferably between 25 to 500 angstroms. Due to the shorter diffusion length of the holes, the p-type layers generally will be as thin as possible. Further, the outermost layer, here n-type layer 20c, will be as thin as possible to avoid absorption of light and need not include the band gap adjusting element or elements.

The photovoltaic device 10 further includes a layer of transparent electrically conductive material 32, which serves as the top electrode of the photovoltaic device. This layer 32, may be deposited over the semiconductor body 12 in a continuous process, or in a separate environment. In one embodiment, the transparent conductive layer 32 is formed of indium tin oxide, although other transparent conductive materials such as zinc oxide, cadmium stannate, tin oxide, and indium oxide are known to skilled practitioners and may also be suitably employed to form the layer.

Figure 2:
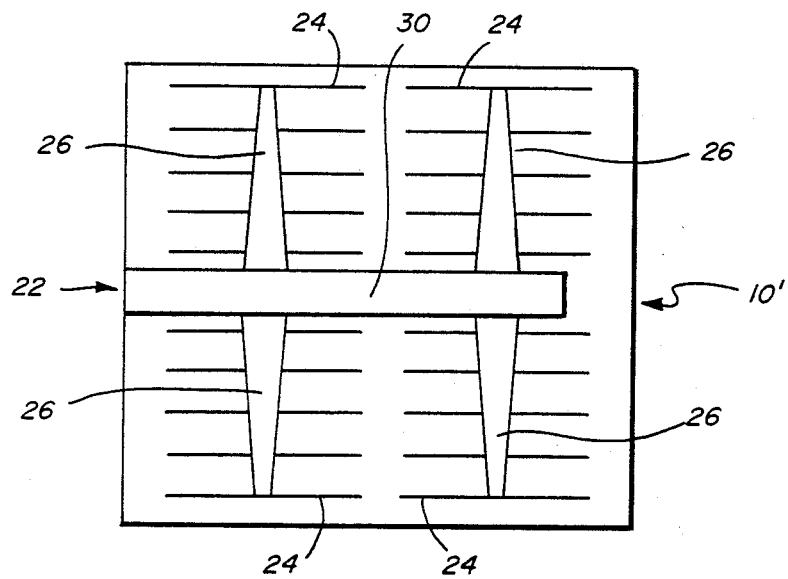
FIG. 2 is a top plan view of a photovoltaic device of the instant invention generally similar to the device of FIGS. 1 or 1A illustrating the bus grid structure thereof.

Photovoltaic device 10 also includes current collection means for efficiently withdrawing photogenerated current from the transparent conductive electrode layer 32. As illustrated in FIG. 1, the current collection means comprises a bus grid structure 22 which includes a bus bar 26 having a plurality of current collecting grid fingers 24 associated therewith. FIG. 2, a top plan view of a photovoltaic device 10', generally similar to the photovoltaic device 10 of Figure 1, illustrates the bus grid structure 22 more fully. It will be noted from an inspection of the Figure that the bus grid structure 22 includes a plurality of grid fingers 24, adapted for collecting current from the photovoltaic device and conveying that current to a bus bar system. The grid fingers 24 communicate directly with a plurality of minor bus bars 26 which in turn are connected to major bus bars 30, adapted to carry photogenerated currents to a terminal of the photovoltaic device 10'.

It is a notable feature of the instant invention that the photovoltaic device 10 includes a pattern of electrical current flow restricting material disposed so as to prevent flow of electrical current to the current collection means from regions of the semiconductor body disposed directly therebeneath. As illustrated in FIG. 1, this pattern of electrical current flow restricting material 29 is disposed between the transparent conductive laye 32 and the second surface of the semiconductor body 12. The current flow restricting material 29 is provided in a pattern which corresponds generally to at least portions of the pattern of the superadjacent bus grid structure 22, and is formed of a material having a relatively low electrical conductivity. Illustrative of some of the materials having utility in the formation of the pattern of current flow restricting material 29 are organic insulators such as synthetic polymers; inorganic insulators such as silicon oxides, silicon nitride, alumina, and the like; silicones, wide band gap semiconductors, cermets and combinations thereof. When a structure, such as the bus grid structure 22 of FIG. 1 is utilized as the current collection means it is desirable that the pattern of current flow restricting material 29 corresponds to at least the bus bar portion of the bus grid structure, although the pattern may be advantageously configured to conform to the grid fingers 24 thereof also. It is generally preferred that the pattern of current flow restricting material 29 cover an area which is slightly larger than the area covered by the superposed portion of the current collection means which it is protecting so as to afford the greatest protection from low resistance defects. Generally an excess in area of 10% to 15% is sufficient. While any layer that offers resistance to current flow will have utility in the practice of the instant invention, it is generally desired that the pattern of current flow restricting material have a sheet resistance of more than 300 ohms/square and preferably a sheet resistance of at least 1000 ohms/square.

The pattern of current flow restricting material may be deposited through a wide variety of techniques available to those skilled in the art. For example, the pattern may be formed by screen printing a layer of resistive material, such as a silicone material or an organic polymer onto the semiconductor body. Likewise, vacuum deposition techniques, such as vacuum evaporation, sputtering, or plasma deposition may be utilized to provide a wide variety of materials suitable for forming the layer. The appropriate pattern may be formed by depositing through mask or by utilizing photolithographic patterning techniques as is well known to skilled in the art of semiconductor device manufacture. The current flow restricting material may also be provided by directly oxidizing or nitriding the surface of the semiconductor body by exposing the semiconductor body to the appropriate reagents, or by employing plasma techniques or electrochemical techniques. Similarly, electrodeposition processes such as electroplating, anodization, and electrolessplating techniques may also be utilized either singly or in combination to provide the low conductivity pattern. It should be noted that there are a wide variety of techniques available to those skilled in the art, which techniques may be readily adapted for the deposition of patterns of materials having utility in the fabrication of the current flow restricting pattern of the instant invention, the practice of which is not intended to be restricted to any specific deposition technique.

While the cell illustrated in FIG. 1 is a stacked assembly of p-i-n cells, the instant invention is also applicable to other cell arrangements such as single p-i-n cells, stacked or single n-i-p cells, p-n cells, Schottky barrier cells, and the like. Accordingly, in the description and claims the layer or layers of semiconductor material disposed between substrate 14 and the bus grid structure 22 are generally referred to as the "semiconductor body," and this term is intended to include combinations of semiconductor layers of various conductivities and materials which will provide for a flow of electrical current when appropriately combined with one or more electrodes. This flow of electrical current is specifically defined to include the switching of current accomplished by photodiodes and phototransistors, as well as the generation of and collection of current accomplished by photovoltaic devices such as solar cells. Regardless of its ultimate configuration, it is for the purpose of substantially reducing the rate of flow of current through low resistance current paths between the substrate electrode and the current collection means that the instant invention was developed.

Figure 1A:
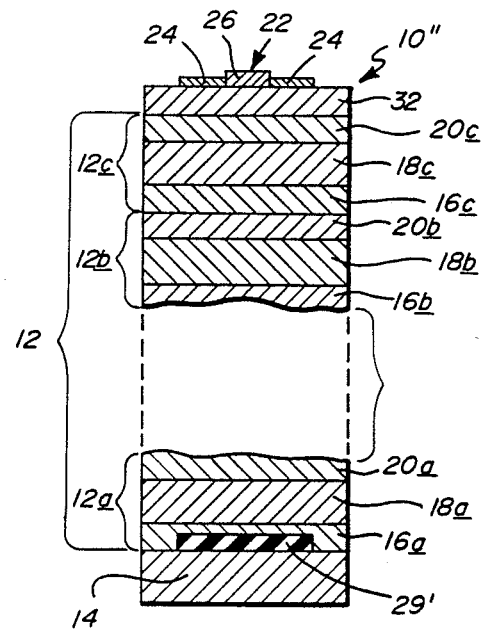
FIG. 1A is a fragmentary, cross-sectional view of a second tandem photovoltaic device also structured in accord with the principles of the instant invention and also comprising a plurality of p-i-n type photovoltaic cells.

Referring now to FIG. 1A, there is depicted another photovoltaic device 10" embodying the instant invention. The photovoltaic device 10" is generally similar to the photovoltaic device 10 depicted in FIG. 1, insofar as it is a triple tandem p-i-n type photovoltaic device; accordingly like structures will be referred to by like reference numerals. Where the photovoltaic device 10" of FIG. 1A differs from the photovoltaic device 10 of FIG. 1 is in the disposition of the pattern of current flow restricting material 29'. While the pattern in the photovoltaic device 10 of FIG. 1 is disposed between the semiconductor body 12 and the transparnt conductive electrode 32, the analogous pattern 29' in the photovoltaic of 10" of FIG. 1A is disposed between the substrate 14 and the first, or bottommost surface of the semiconductor body 12.

The pattern of current flow restricting material 29' of the photovoltaic device of FIG. 1A also functions to restrict flow of current through defect regions. While in the embodiment of FIG. 1A, the bus grid structure 22 is in electrical communication with portions of the semiconductor body 12 directly therebeneath, those portions of the semiconductor body are not in direct electrical communication with corresponding subjacent portions of the substrate 14. Therefore, a direct short circuit path cannot be established between the bus grid structure and the substrate electrode 14.

The pattern of current flow restricting material 29' may be formed by any of the techniques described with reference to FIG. 1, the essence of the invention being that the pattern 29" is disposed beneath at least portions of the bus grid structure 22. In cases where the substrate 14 is formed of a metallic material, the pattern of insulating material 29' may be formed by anodizing, oxidizing, or otherwise chemically treating that metal. For example, an electrically insulating pattern of alumina may be formed by anodizing an aluminum substrate, or an insulating coating may be formed on stainless steel by treatment with oxalic acid. In some cases photovoltaic devices such as the device 10" in FIG. 1A are formed upon electrically insulating substrates such as polyimide coated metal, and an electrically conductive metallic pattern of base electrodes is provided atop the insulating surface of the substrate via techniques such as vacuum deposition of metals. In such instances the pattern of electrically insulating material 29' may be advantageously formed by merely not metallizing those portions of the insulating substrate which will form the insulating pattern. Alternatively, the metalization may be etched away in a patternwise manner to expose the underlying insulating surface of the substrate.

The particular configurations of the photovoltaic devices of the instant invention provide for increased tolerance of defects which create low resistance current paths through said devices. As discussed previously, such defects are derogatory to the performance of photovoltaic devices in which they occur because they shunt sufficient current to either (1) decrease the efficiency of the device or (2) destroy the device. Major problems occur when such defects are in close proximity to the bus grid structure or other current collection means of the photovoltaic device because such defects can then effectively short circuit the entire device through the current collection means. The device of the instant invention prevents such an occurance because it effectively masks at least major portions of the current collection means from short circuit current paths which may occur directly therebeneath. Defects occuring remote from the current collection means will have a minimal effect upon the device since any current flowing therethrough will have to laterally traverse the transparent conductive electrode layer thereof before reaching the current collection means. In such instances the lateral resistance of the transparent conductive oxide layer will enable that layer to function as current limiting resistor which will effectively buffer the flow of large amounts of electrical current therethrough. Furthermore, the current collection means itself may be configured in accord with the principles disclosed in the aforementioned U.S. Pat. Nos. 4,590,327 and 699,523 patent application so as to provide still further protection from defects. For example, the photovoltaic device may be provided with a bus grid structure having grid fingers adapted to limit the flow of electrical current therethrough to a value which is no more than 5 times the amount of current which would normally be expected to be collected from the photovoltaic device by said fingers under normal operating conditions. In this manner, the flux of large amounts of current through the fingers, to the bus bars is prevented. Such current limiting function may be accomplished in accord with the principles disclosed in the aforementioned applications by (1) making the grid fingers of a resistive material (2) connecting the grid fingers to the bus bar via links of resistive material or (3) connecting with therid fingers to the bus bar system via fusible links which are adapted to melt and open the circuit when a predetermined amount of current flow is exceeded.

Figure 3:
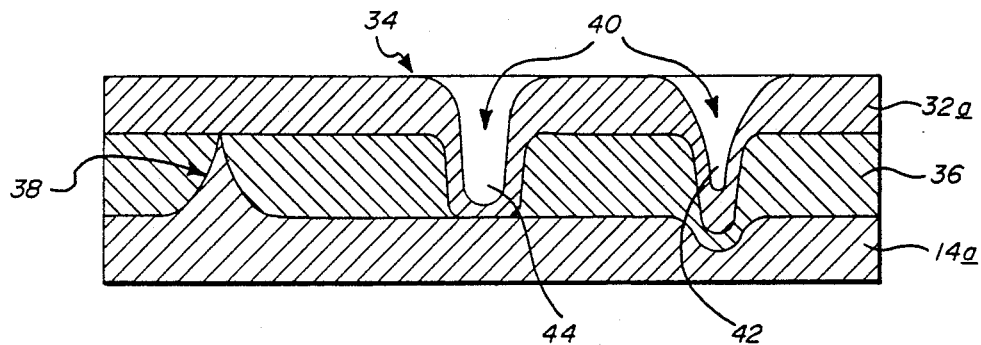
FIG. 3 is a cross-sectional view of a portion of a photovoltaic device illustrating various types of defects therein.

The formation and effect of the previously discussed defects will be better understood by reference to FIG. 3 which illustrates a portion of a photovoltaic device 34 including a substrate 14a, an active semiconductor body 36, and a transparent conductive layer 32a. A first defect region is depicted by a raised protuberance or spike 38 associated with and extending from the deposition surface of substrate 14a. Raised spike 38 may result from, inter alia, (1) metallurgical irregularities such as impurities, inclusions, columnar growth, etc. in the material from which substrate 14a is formed, (2) mechanical damage due to nicks, abrasions, etc. occuring during handling of substrate 14a, (3) dust or other particulate matter contaminating the surface of substrate 14a during handling, processing, etc. thereof. Spike 38 is of sufficient height so as to be either incompletely or inadequately covered by the subsequently deposited layers making up the semiconductor body 36. In this manner, a defect region is formed in the immediate vicinity of the spike 38, which provides a low resistance current path between conductive layer 32a and substrate 14a since the thickness, if any, of the semiconductor body 36 separating the two electrodes is insufficient to prevent current from shunting therebetween.

A second illustrated defect region is formed in the immediate vicinity of a crater, generally 40, which can originate in either (1) substrate 14a, or (2) semiconductor body 36 of photovoltaic device 34. As herein defined, "craters" include depressions in (1) the deposition surface of substrate 14a, or (2) regions of photostatic device 34 onto which insufficient semiconductor material is deposited, thereby causing conductive layer 32a and substrate 14a to either (1) electrically approach, or (2) come into direct electrical contact with one another. Causes of such craters 40, which may also be referred to as pin holes or pits, may include (1) metallurgical or chemical irregularities in the surface of the substrate 14a, (2) impurities and inclusions in the semiconductor body 36, or (3) nonuniform deposition of the semiconductor layers or defective growth of the semiconductor body. Regardless of how crater 40 originates, deposition of the transparent conductive material 32a (in one embodiment, indium tin oxide) over a portion of the semiconductor body 36 having crater 40 formed therein, results in the electrode material at least being partially deposited thereinto. A low resistance current path is thereby established between substrate 14a and conductive layer 32a through which electrical current is diverted from its normal path of travel through semiconductor body 36 of photovoltaic device 34. In FIG. 3, a crater formed due to a defect in substrate 14a is illustrated by reference numeral 42, while a crater formed due to nonuniform deposition of semiconductor body 36 is illustrated by reference numeral 44.

A third type of defect (not shown) which can arise is poor quality regions of the semiconductor body. These regions, which may be of improper composition or defective growth or morphology, exhibit low electrical resistivity relative to the remainder of the semiconductor body, and can thus provide a low-resistance current path between electrodes of the device.

Referring now to the previously mentioned "operational mode failures," said failures are manifested by a sudden catastrophic inability of the photovoltaic device to function under normal operating conditions even though the device has actively generated current for some period of time. Applicants believe operational mode failures result from a current or voltage driven reaction which exacerbates or intensifies latent defects existing in the photovoltaic device. Extremely high current densities are readily attained across defect sites having low resistivities. For example, a one micron square defect having a potential of one volt imposed thereacross could reach a current density of 100 Amperes/$cm^2$ which would destroy the device. Further, it is possible that under the influence of the electrical field developed between conductive layer 32a and substrate 14a when photovoltaic device 34 is operatively employed to produce electrical energy from incident light energy, electrode material may migrate across a defect site such as crater 40 or protuberance 38. Since the defect site is incompletely filled or covered upon deposition of the semiconductor material, even very slight migration may be sufficient, over a period of time, to establish a low resistivity current path through that defect site, effectively short circuiting the device. Once such a low resistance current path is established, large amounts of current can readily flow therethrough and damage the overall operation of the photovoltaic device. Another possible explanation for operational mode failure might involve Joule heating and the resultant degradation of the semiconductor material proximate a defect region as current flows through that defect region.

Regardless of the cause and/or nature of the defects, the present invention substantially prevents the free flow of electrical current through these defect regions to the bus grid structure. Thus, the instant invention provides for a defect tolerant photovoltaic device.

Figure 4:
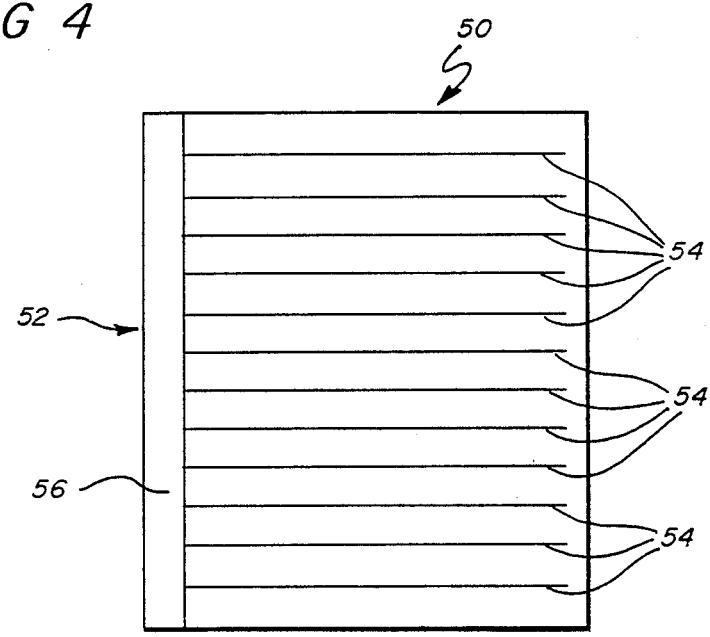
FIG. 4 is a top plan view of a third photovoltaic device of the instant invention, illustrating the bus bar structure thereof.

The principles of the instant invention may be adapted to fabricate a wide variety of differently configured photovoltaic devices. FIG. 4, which is a top plan view, illustrates a large area photovoltaic device 50, embodying the instant invention. The device is generally similar to the photovoltaic device 10 of FIG. 1 with the exception that the current collection means is a bus bar structure 52 rather than the bus grid structure 22 depicted in FIGS. 1 and 2.

The bus bar structure 52 comprises a plurality of minor bus bars 54 electrically communicating with a major bus bar 56. The minor bus bars 54 cover the entire upper transparent electrode surface of the photovoltaic device 50 and are adapted to collect and carry photogenerated current from said upper electrode to the major bus bar 56. The spacing of the minor bus bars 54 will depend inter alia, upon the amount of electrical current produced by the photovoltaic device, the resistivity of the transparent conductive top electrode and the resistivity of the material forming the minor bus bars 54. Generally, it has been found that for tandem p-i-n photovoltaic devices generally similar to those described with reference to FIG. 1 and provided with minor bus bars formed of screen printed silver paste, a spacing of approximately 0.5 to 1.0 centimeters between minor bus bars 54 is sufficient to assure that all photogenerated current will be effectively collected. Of course, for different types of devices formed of different materials, different minor bus bar spacings may be employed.

The major bus bar 56 is adapted to carry relatively large amounts of current from the minor bus bars 54 to a terminal portion of the photovoltaic device 50. Accordingly, the major bus bar 56 is of higher current carrying capacity, and generally larger in size than the minor bus bars 54. According to the principles of the instant invention, a low electrical conductivity material, as previously described, is disposed atop the semiconductor body, and beneath the transparent conductive top electrode of the photovoltaic device 50 in a pattern corresponding to superadjacent portions of the bus bar structure 52.

By employing the bus bar configuration depicted in FIG. 4, the need for current collecting grid fingers is eliminated. Consequently, larger portions of the photovoltaic device may be actively employed for the generation of current insofar a shading of the active semiconductor body by the multiplicity of grid fingers is eliminated. By employing a configuration of photovoltaic device structured in accord with the principles of the instant invention and as depicted in FIG. 4, the necessity for subdividing a large area photovoltaic device into a plurality of discrete electrically isolated portions is eliminated. Consequently, photovoltaic devices such as that depicted in FIG. 4 may be fabricated in extremely long lengths which may subsequently be cut to shorter lengths to suit particular applications.

The bus bar pattern 52 may be formed by a wide variety of procedures and from a wide variety of materials insofar as it will be deposited atop the photovoltaic device after completion of all vacuum deposition procedures. For example, the major bus bar 56 may be formed by adhesively affixing an electrically conductive member such as a copper foil to the surface of the device and the minor bus bars 54 may subsequently be formed by screen printing a conductive paste onto the device. Alternatively, the minor bus bars may be formed by affixing current carrying members such as metallic wires or tapes to the surface of the photovoltaic device with an electrically conductive adhesive. Similarly, the entire bus bar structures 56, may be formed by screen printing techniques. Electroplating or electroless plating processes may also be employed to form the major and/or minor bus bars directly upon the surface of the photovoltaic device.

The layers forming the semiconductor body 12 of photovoltaic devices structured in accord with the principles of the instant invention may be readily prepared by any method suited for the preparation of thin film semiconductor materials. Among such methods are vacuum deposition techniques including sputtering, evaporation, glow discharge decomposition of a precursor gas, chemical vapor deposition, and the like.

Furthermore, nonvacuum deposition techniques such as electroplating, pyrolytic deposition, etc., may be similarly employed to fabricate the semiconductor layers. There are a wide variety of techniques known and available to skilled artisans for the fabrication of the patterns, of current flow restricting material, the current collection structures and the transparent conductive electrode layer; among these techniques are vacuum evaporation techniques, sputtering techniques, glow discharge decomposition techniques, electroplating techniques, electroless plating techniques and the like.

It should finally be noted that a photovoltaic device structured in accord with the instant invention is preferably encapsulated in a transparent, protective, electrically insulating material so as to increase its durability and resistance to ambient atmospheric conditions.

While the instant invention has been described with reference to particular embodiments it is to be understood that numerous changes, modifications and substitutions may be made in accord with the principles of the instant invention. The drawings and description thereof are meant to be illustrative of the principles and practice of the instant invention and not limitations thereupon. It is the following claims, including all equivalents, which are meant to define the instant invention.

What is claimed is:

1. In a semiconductor device including: a substrate; a semicond-uctor body having a first surface thereof disposed on said substrate; a layer of transparent, electrically conductive material overlying, and in electrical conductive material overlying, and in electrical contact with, at least a portion of the second surface of the semiconductor body; and, current collection means disposed atop said layer of transparent, conductive material, and comprised of a bus-grid structure including a plurality of grid fingers for collecting current from the transparent conductive layer, and a bus bar structure in electrical communication with said grid fingers for carrying the current collected thereby; the improvement comprising:
   a pattern of electrical current flow restricting material disposed between the transparent conductive layer and the substrate, said pattern corresponding to, and disposed beneath, substantially all of the bus bar structure of the superjacent current collection means, whereby the flow of electrical current between said bus bar structure and regions of the substrate disposed therebeneath is substantially eliminated.

2. A semiconductor device as in claim 1, wherein said pattern of current flow restricting material is disposed between the transparent conductive layer and the second surface of the semiconductor body.

3. A semiconductor device as in claim 1, wherein said pattern of current flow restricting material is disposed between the first surface of the semiconductor body and the substrate.

4. A semiconductor device as in claim 1, wherein said current flow restricting material is chosen from the group consisting essentially of: organic insulating materials, inorganic insulators, wide band gap semiconductors, silicones, cermets, and combinations thereof.

5. A semiconductor device as in claim 1, wherein said current flow restricting material has a sheet resistance of at least 300 ohms/square.

6. A semiconductor device as in claim 1, wherein said pattern of current flow restricting material is approximately 10% to 15% longer and wider than the corresponding portions of the bus bar structure.

7. A semiconductor device as in claim 1, wherein said pattern of current flow restricting material corresponds to both the grid fingers and the bus bar structure of the bus-grid structure.

8. A semiconductor device as in claim 7, wherein said pattern of current flow restricting material is approximately 10 to 15% longer and wider than the corresponding portions of the bus grid structure.

9. A semiconductor device as in claim 1, wherein each of said plurality of grid fingers includes a resistive link for establishing electrical communication with said bus bar structure.

10. A semiconductor device as in claim 1, wherein each of said plurality of grid fingers includes a fusibile link for establishing electrical communication with said bus bar structure.

11. A semiconductor device as in claim 1, comprising a photovoltaic device wherein said semiconductor body is adapted to photogenerate electrical current in response to the absorption of photons.

12. A photovoltaic device as in claim 11, wherein said semiconductor body includes at least one triad of semiconductor layers; said at least one triad including a p-type conductivity semiconductor layer, a n-type conductivity semiconductor layer and a layer of intrinsic semiconductor material disposed therebetween.

13. A photovoltaic device as in claim 11, wherein said bus grid structure includes a plurality of grid fingers for collecting photogenerated current from the transparent electrically conductive layer and the current carrying capability of each of said plurality of grid fingers is approximately 5 times or less than the amount of current which can be generated by the area of the photovoltaic device for which each of said grid fingers collect current.

14. A semiconductor device as in claim 1, wherein said current collection means comprises a bus bar structure including a plurality of minor bus bars, and at least one major bus bar; said minor bus bars adapted to collect current from the transparent conductive layer and carry said current to the at least one major bus bar which is adapted to carry said current to a terminal of the device.

15. A method of fabricating a semiconductor device of the type including: an electrically conductive substrate; a semiconductor body having a first surface thereof disposed on said substrate; a layer of transparent, electrically conductive material overlying and in electrical contact with at least a portion of second surface of the semiconductor body; and, current collection means disposed atop said layer of transparent, conductive material, said current collection means comprised of a bus-grid structure including a plurality of grid fingers for collecting current from the transparent conductive layer, and a bus bar structure in electrical communication with said grid fingers for carrying the current collected thereby; the method including the step of:

depositing a pattern of electrical current flow restricting material between the transparent conductive layer and the substrate, said pattern corresponding to, and disposed beneath substantially all of the bus bar structure of the superadjacent current collection means.

16. A method as in claim 15, wherein the step of depositing said pattern of current flow restricting material includes the further step of choosing said material from the group consisting essentially of: organic insulating materials, inorganic insulators, wide band gap semiconductors, silicones, cermets, and combinations thereof.

17. A method as in claim 15, wherein the step of depositing said pattern of electrical current flow restricting material comprises vacuum depositing said pattern.

18. A method as in claim 15, wherein the step of depositing said pattern of electrical current flow restricting material comprises screen printing said pattern.

19. A method as in claim 15, wherein the step of depositing said pattern of electrical current flow restricting material includes the step of electrodepositing at least a portion of said pattern.

20. A method as in claim 15, wherein the step of depositing said pattern of electrical current flow restricting material comprises depositing said pattern between the transparent conductive layer and the second surface of the semiconductor body.

21. A method as in claim 15, wherein the step of depositing said pattern of electrical current flow restricting material comprises depositing said pattern between the first surface of the semiconductor body and the substrate.

22. A method as in claim 15, wherein the substrate is a metallic member and the step of depositing said pattern of electrical current flow restricting material includes the step of anodizing at least a portion of said substrate.

23. A method as in claim 15, wherein the substrate is a metallic member and the step of depositing said pattern of electrical current flow restricting material includes the step of chemically oxidizing at least a portion of said substrate.

24. A method as in claim 15, wherein the substrate has at least one electrically insulating surface thereupon, the method including the further step of: depositing at least one electrically conductive member upon the insulating surface of said substrate, said electrically conductive member in electrical communication with the first surface of the semiconductor body and including therein at least one non-electrically conductive region adapted to provide said pattern of electrical current flow restricting material.

25. A method as in claim 15, wherein the step of depositing said pattern of electrical current flow restricting material includes the step of depositing a pattern having a sheet resistance of at least 300 ohms/square.

26. A method as in claim 15, wherein the step of depositing said pattern of electrical current flow restricting material comprises depositing a pattern corresponding to the entirety of the current collecting means.

27. A method as in claim 15, wherein the step of depositing said pattern of electrical current flow restricting material comprises depositing a pattern which is approximately 10 to 15% longer and wider than corresponding, superjacent portions of the current collection means.

* * * * *